United States Patent
Chang et al.

(10) Patent No.: US 7,170,146 B2
(45) Date of Patent: Jan. 30, 2007

(54) TFT STRUCTURE AND METHOD FOR MANUFACTURING THE SAME

(75) Inventors: Shih-Chang Chang, Hsinchu (TW); De-Hua Deng, Taoyuan (TW); Yaw-Ming Tsai, Taichung (TW)

(73) Assignee: Toppoly Optoelectronics Corp., Chu-Nan (TW)

( * ) Notice: Subject to any disclaimer, the term of this patent is extended or adjusted under 35 U.S.C. 154(b) by 69 days.

(21) Appl. No.: 10/834,337

(22) Filed: Apr. 28, 2004

(65) Prior Publication Data

US 2004/0217356 A1 Nov. 4, 2004

(51) Int. Cl.
*H01L 23/58* (2006.01)

(52) U.S. Cl. ............... 257/632; 257/408; 257/524; 438/157; 438/164

(58) Field of Classification Search ............. 438/151, 438/157, 163, 164
See application file for complete search history.

(56) References Cited

U.S. PATENT DOCUMENTS

| 5,292,675 | A  | * | 3/1994 | Codama ............... 438/163 |
| 6,429,485 | B1 |   | 8/2002 | Ha et al. |
| 6,563,135 | B2 | * | 5/2003 | Park ................... 257/72 |
| 6,624,443 | B2 | * | 9/2003 | Tanabe et al. ........... 257/59 |

* cited by examiner

*Primary Examiner*—Zandra V. Smith
*Assistant Examiner*—Pamela E Perkins
(74) *Attorney, Agent, or Firm*—Volpe & Koenig, P.C.

(57) ABSTRACT

A thin film transistor (TFT) structure includes a substrate, a polysilicon structure including a plurality of channel regions, at least one lightly doped region and at least one heavily doped source/drain region, a plurality of gate structures, and an insulating layer formed between the gate structures and the polysilicon structure. The thickness of a first portion of the insulating layer under and between the gate structures is greater than the thickness of a second portion of the insulating layer adjacent to the first portion. At least one lightly doped region is formed under the first portion of the insulating layer and at least one heavily doped source/drain region is formed under the second portion of the insulating layer via the same doping procedure.

6 Claims, 6 Drawing Sheets

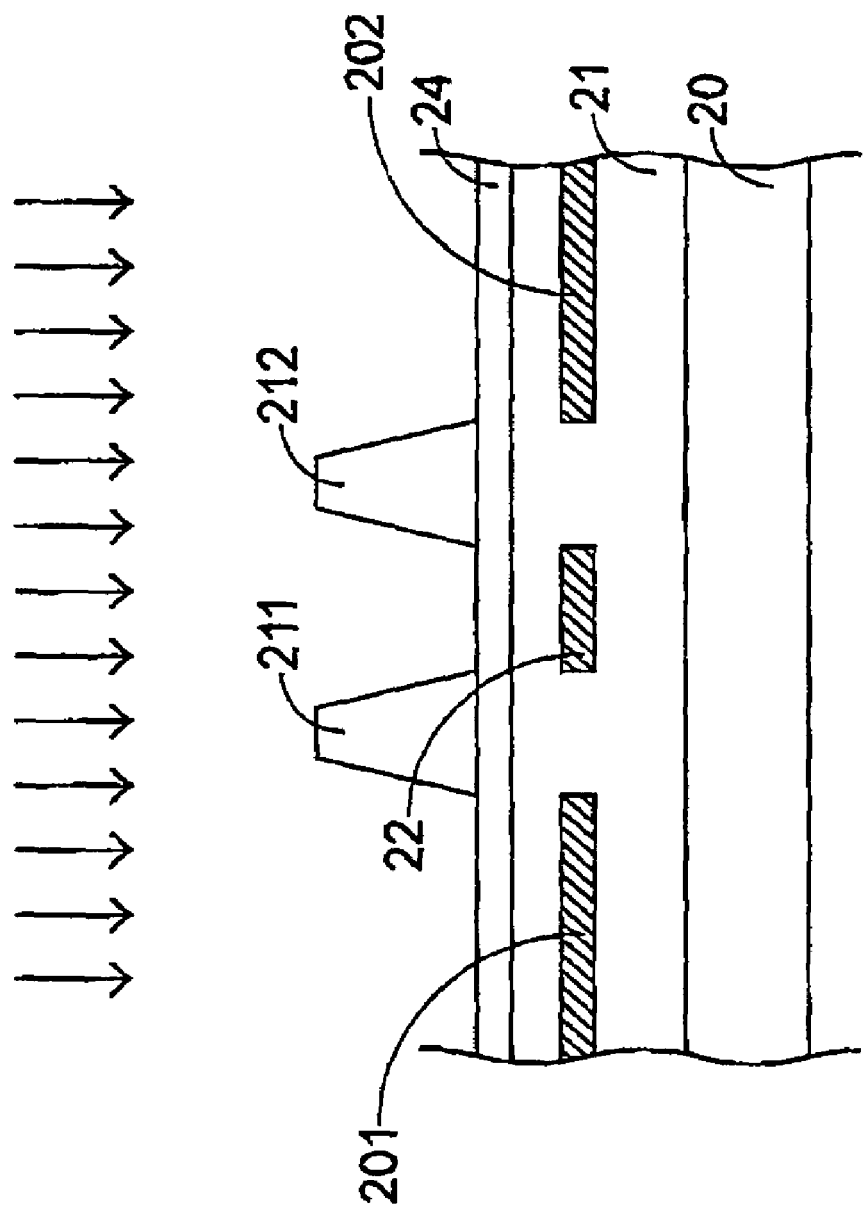

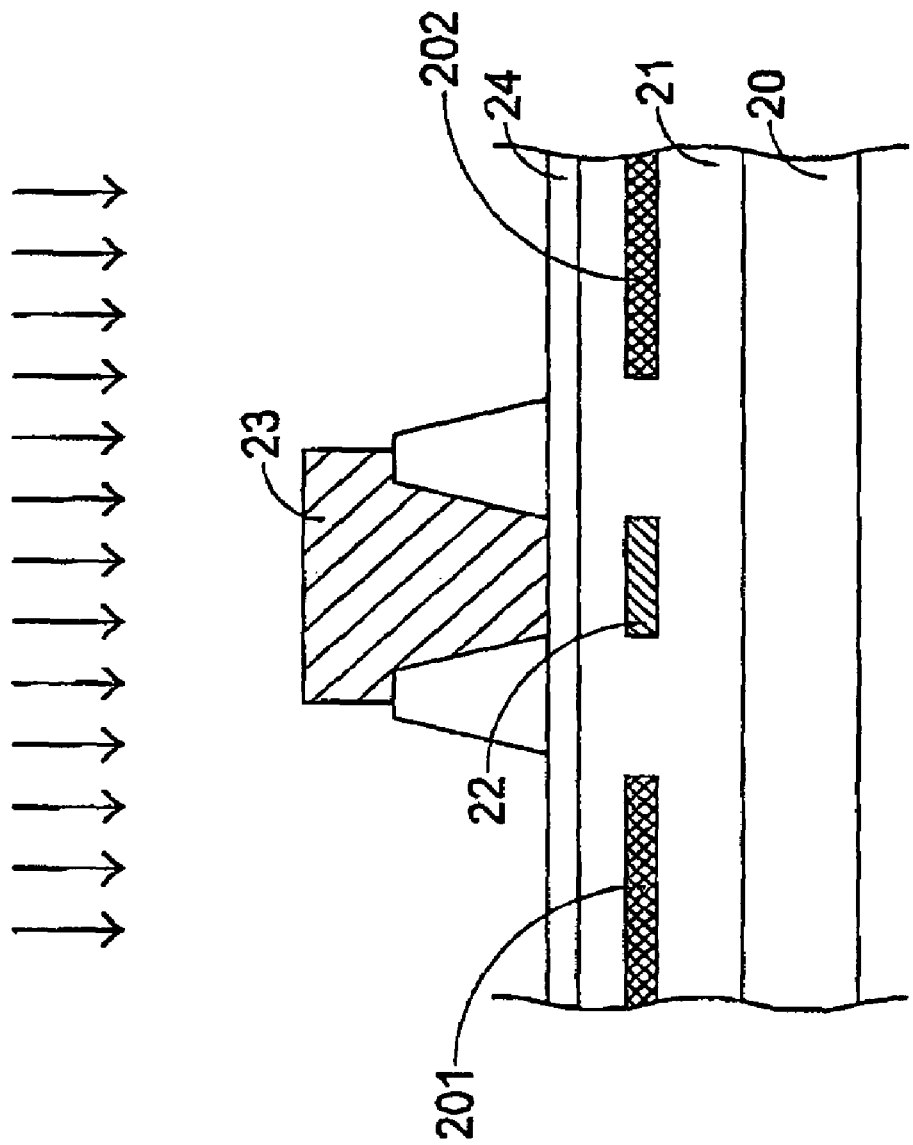

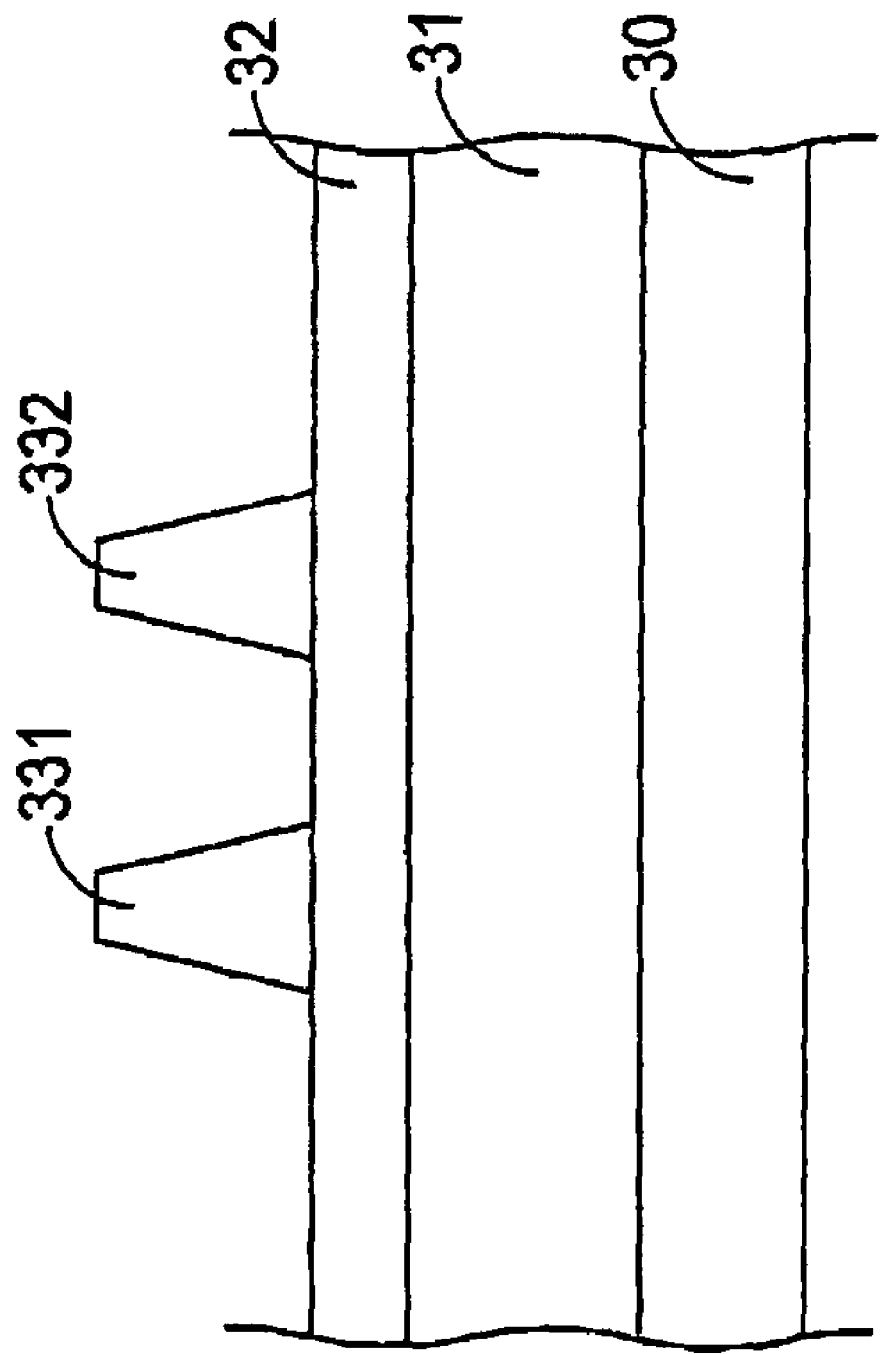

TFT STRUCTURE AND METHOD FOR MANUFACTURING THE SAME

FIELD OF THE INVENTION

The present invention relates to a structure of a thin film transistor (TFT), and more particularly to a TFT structure for use in a planar display device or other integrated circuit. The present invention also relates to a method for manufacturing a structure of a thin film transistor (TFT) for use in a planar display device or other integrated circuit.

BACKGROUND OF THE INVENTION

Please refer to FIG. 1 which illustrates the circuit of a pixel unit in a conventional thin film transistor liquid crystal display (TFT-LCD). The pixel unit includes a TFT unit 11, a pixel 12 and a storage capacitor 15. The TFT unit 11 is used as a switch unit controlled by a voltage Vs of scan line to turn on or off. The pixel 12 includes a pixel electrode 131, a common electrode 132 and liquid crystal layer 133. When the TFT unit 11 is switched ON, a voltage Vd of data line is applied between the pixel electrode 131 and the common electrode 132 of the pixel 12 for changing the orientation status of the liquid crystal molecules of liquid crystal layer 133. In such way, the transmittance of the pixel 12 can be adjusted so as to change the illumination of that pixel in response to the light emitted from a backlight source 14. The storage capacitor 15 electrically connected to the TFT unit 11 and the pixel 12 is used to store voltage Vd between the pixel electrode 131 and the common electrode 132 of the pixel 12.

According to a conventional process for producing a low temperature polysilicon thin film transistor (LTPS-TFT), the TFT unit 11 is implemented as an N-channel metal oxide semiconductor field effect transistor (NMOS-FET). However, when the channel of NMOS-FET is largely shortened due to high integrity, a so-called "hot electron effect" is likely to occur so as to affect the normal operation of the device. For solving this problem, NMOS-FET having a lightly doped drain (LDD) structure has been developed to be used in the LTPS-TFT liquid crystal display (LCD). During the procedure for forming the LDD structure, a photo misalignment problem occurs. Hence, a conventional self-align intra-gate TFT is developed.

FIGS. 2A and 2B show a conventional procedure for producing the self-align intra-gate TFT. As shown in FIG. 2A, the TFT includes an LTPS layer 21 formed on a substrate 20, an insulating layer 24 formed on the LTPS layer 21 and two sub-gate electrodes 211 and 212 formed on the insulating layer 24. After the first ion implantation procedure, two source/drain regions 201 and 202 and a self-align intra-gate lightly doping (SA-IGLD) region 22 are doped. Subsequently, a mask 23 is applied over and between two sub-gate electrodes 211 and 212 and then the second ion implantation procedure is performed. Hence, two source/drain electrodes are formed by heavily doping the source/drain regions 201 and 202, while the SA-IGLD region 22 covered by the mask 23 remains lightly doped. The resulting TFT structure has electric features comparable with that having a lightly doping drain (LDD) structure. However, it is still necessary to perform two ion implantation procedures with different implantation energies and dosages to accomplished the above structure. Consequently, such complicated procedures are involved and the production rate is reduced.

Therefore, the purpose of the present invention is to develop a TFT structure and a method for manufacturing the TFT to deal with the above situations encountered in the prior art.

SUMMARY OF THE INVENTION

The present invention is to provide a TFT structure and a TFT-manufacturing method for use in a planar display device. The method involves simplified ion-implantation procedures, and the structure maintains satisfactory electric property.

According to an aspect of the present invention, it provides a method for manufacturing a thin film transistor (TFT). The method includes steps of providing a substrate, forming a plurality of polysilicon structures on the substrate, forming an insulating layer over the polysilicon structures, forming a plurality of gate structures on the insulating layer, forming a mask over and between the gate structures, etching the insulating layer exposed from the mask so that the thickness of the insulating layer under and between the gate structures is greater than the thickness of the insulating layer in the rest region, and removing the mask, and performing a doping procedure on the resulting substrate with dopants penetrating through the insulating layer with various thicknesses and optionally the gate structures, thereby defining a plurality of channel regions, at least one lightly doped region and at least one heavily doped source/drain region.

According to another aspect of the present invention, it provides a thin film transistor (TFT) structure. The TFT structure includes a substrate, a non-single crystal semiconductor film including a plurality of channel regions, at least one lightly doped region and at least one heavily doped source/drain region, a plurality of gate structures, and an insulating layer formed between the gate structures and the non-single crystal semiconductor film. The thickness of a first portion of the insulating layer under and between the gate structures is greater than the thickness of a second portion of the insulating layer adjacent to the first portion. At least one lightly doped region is formed under the first portion of the insulating layer and at least one heavily doped source/drain region is formed under the second portion of the insulating layer via the same doping procedure.

Preferably, the substrate is a light-transmissible substrate and the non-single crystal semiconductor film is a low temperature poly silicon (LTPS) layer.

BRIEF DESCRIPTION OF THE DRAWINGS

The present invention may best be understood through the following description with reference to the accompanying drawings, in which:

FIGS. 2A–2B are diagrams illustrating a conventional process for producing a TFT structure with the self-align intra-gate lightly doping (SA-IGLD) region; and FIGS. 3A–3C are diagrams illustrating a embodiment of a process for producing a TFT structure with the self-align intra-gate lightly doping (SA-IGLD) region according to the present invention.

DETAILED DESCRIPTION OF THE PREFERRED EMBODIMENT

The present invention will now be described more specifically with reference to the following embodiments. It is to be noted that the following descriptions of this invention are presented herein for purpose of illustration and description only; it is not intended to be exhaustive or to be limited to the precise form disclosed.

Figure 1:
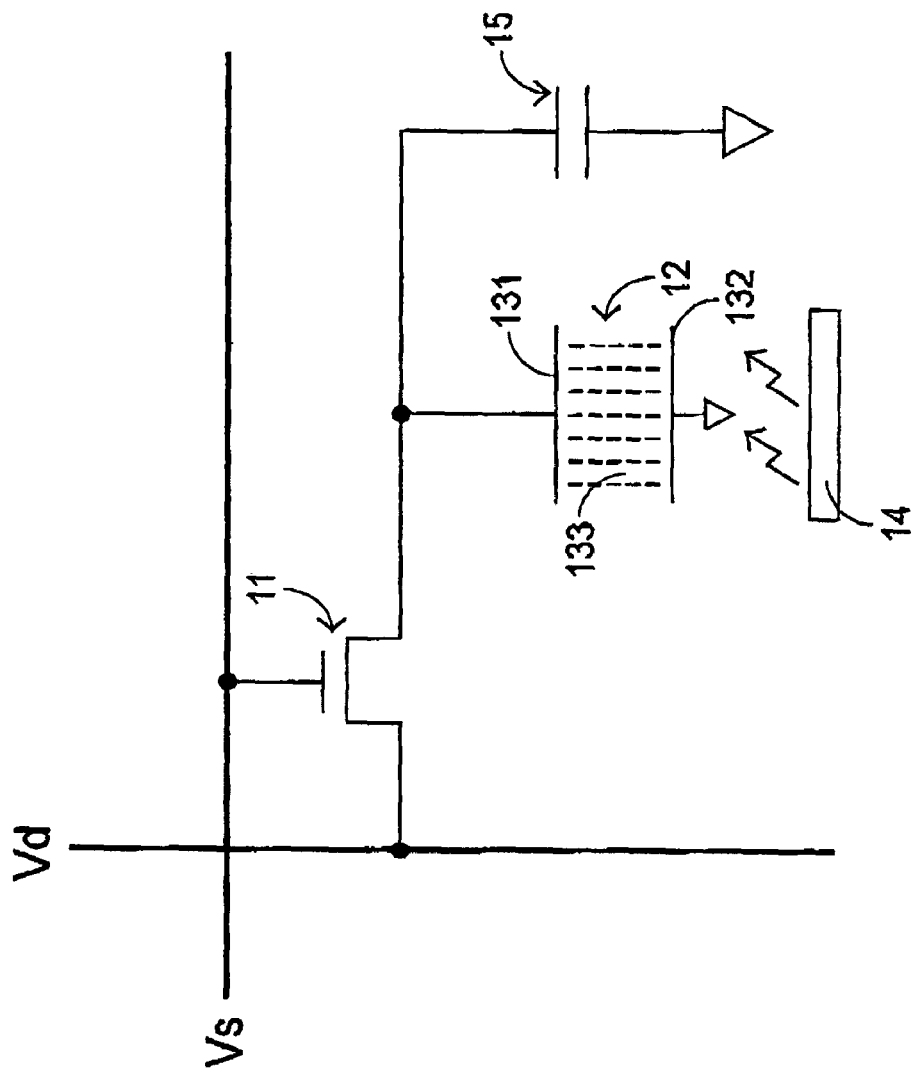
FIG. 1 is a diagram illustrating the circuitry of a pixel unit in a conventional thin film transistor liquid crystal display (TFT-LCD)
Figure 3B:
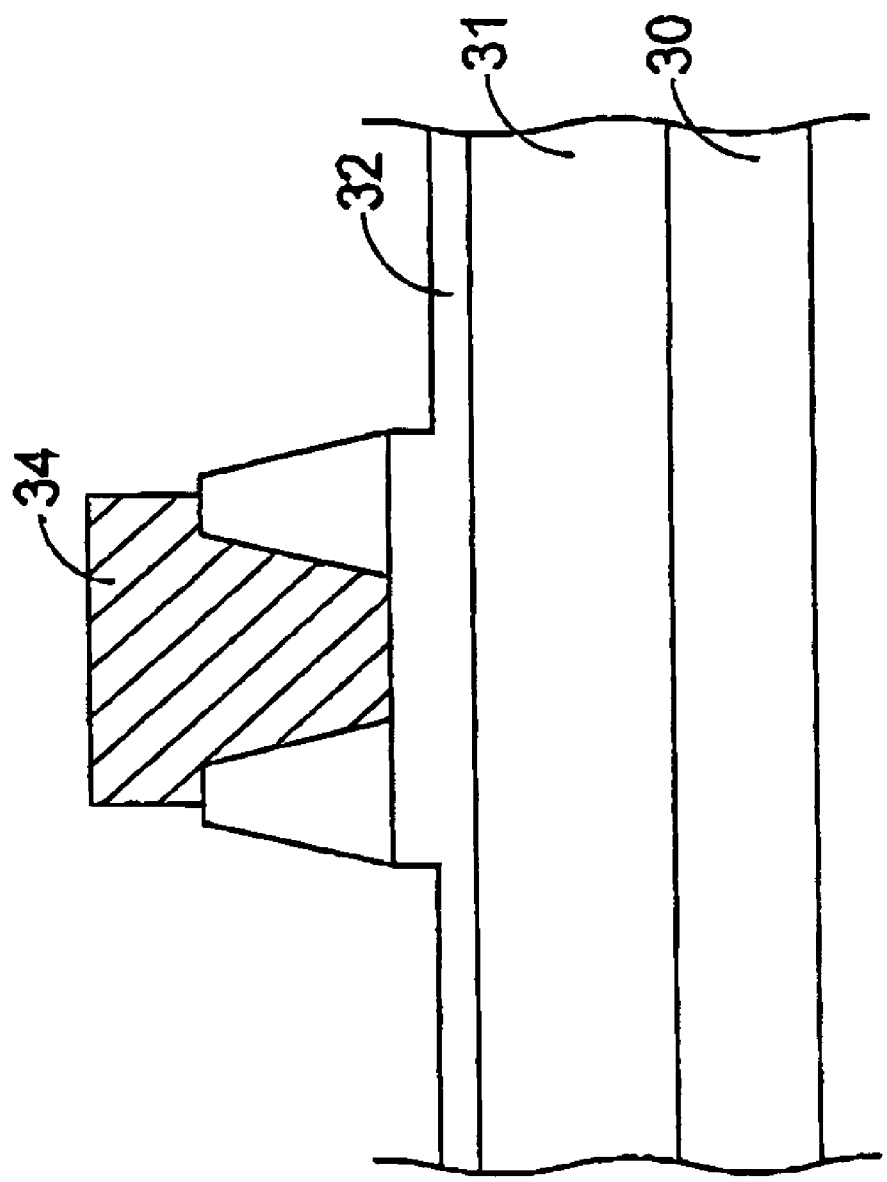
Figure 3C:
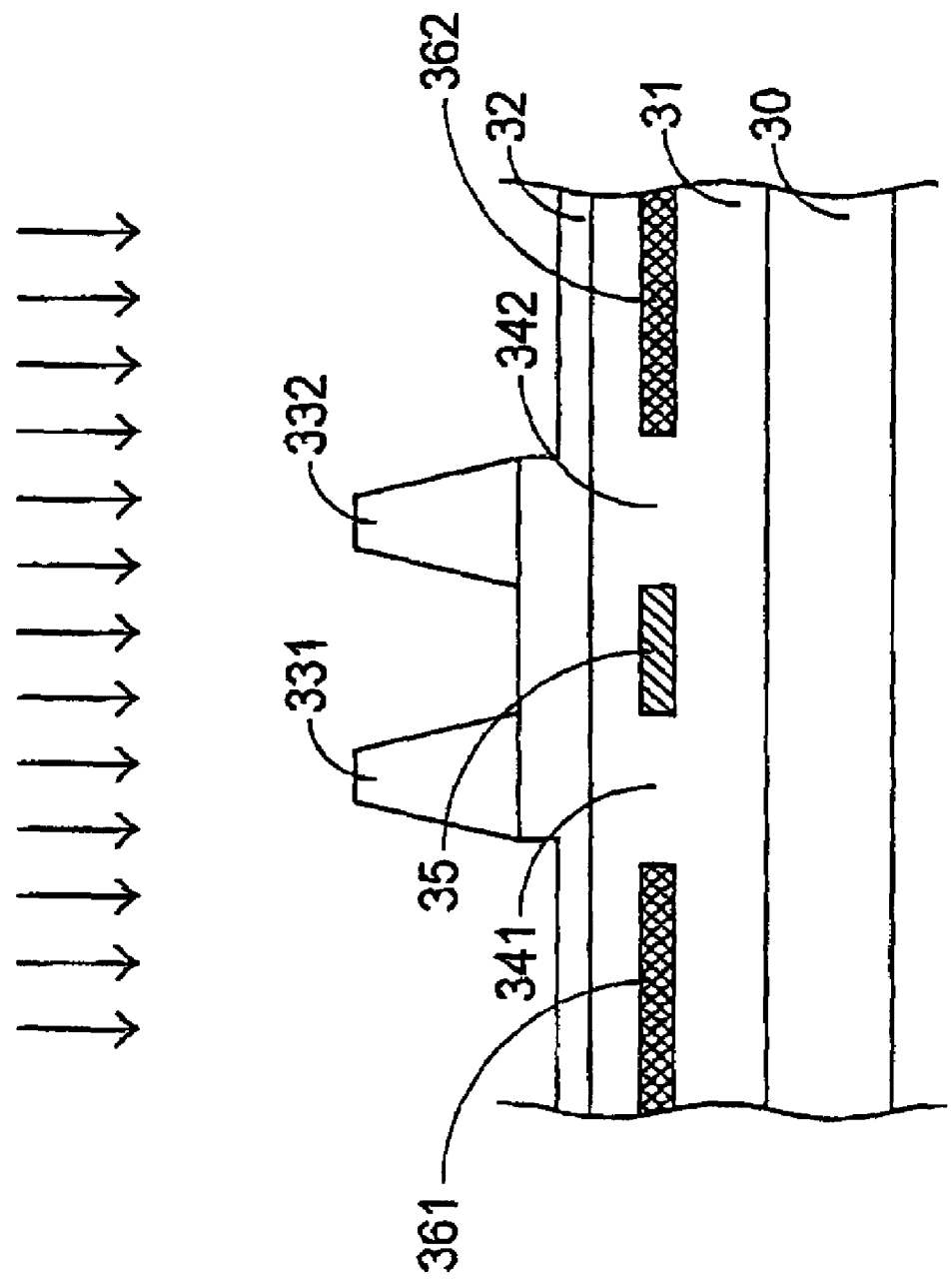

Please refer to FIGS. 3A–3C. The process for producing the TFT structure is performed by forming a ploysilicon layer 31 on a substrate 30. Then, an insulating layer 32 is formed on the polysilicon layer 31 and two sub-gate electrode structures 331 and 332 are subsequently formed on the insulating layer 32. After a mask 34 is applied over and between the sub-gate electrodes 331 and 332 as shown in FIG. 3B, an etching procedure is performed on a selected region of the insulating layer 32 which is not covered with the mask 34. Due to the protection of the mask 34 from the etching agent, the thickness of the insulating layer 32 under and between the two sub-gate electrodes 331 and 332 is greater than that in the rest region. Subsequently, the mask 34 is removed, and an ion implantation procedure is performed. In such way two heavily doped regions 361 and 362 and a SA-IGLD region 35 are simultaneously formed in the polysilicon layer 31, as shown in FIG. 3C, with the same implantation energy and dosage. In other words, the lightly doped region 35, heavily doped source/drain regions 361 and 362 and channels 341 and 342 can be simultaneously defined in a single doping procedure by way of previously varying the thickness of the overlying insulating layer 32.

Unlike the prior art, it is unnecessary to perform two ion implantation procedures with different implantation energies and dosages to accomplish the TFT structure having the SA-IGLD region 35 and heavily doped source/drain regions 361 and 362. Therefore, the process can be simplified and the throughput can be promoted.

The polysilicon layer used in the present invention is preferably a low temperature poly silicon (LTPS) layer. The insulating layer used in the present invention can be silicon nitride, silicon oxide, or the combination thereof. The TFT produced according to the present invention has particularly satisfactory performance when the length of the channel region is smaller than 6 μm. The insulating layer under the gate structures has thickness varying from 200 to 1000 Å. Preferably, the mask is a photoresist and the doping procedure is an N-type ion implantation procedure with constant energy and dosage. The TFT structure and the producing method thereof according to the present invention, although illustrated with reference to a planar display device, such as liquid crystal display, can also be applied to an integrated circuit chip.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a thin film transistor (TFT) comprising the steps of:

providing a substrate; forming a non-single crystal semiconductor film over said substrate; forming an insulating layer over said non-single crystal semiconductor film, said insulating layer comprising a relatively thicker portion and a relatively thinner portion; and performing a doping procedure with dopants penetrating through said insulating layer, thereby simultaneously forming, in said non-single crystal semiconductor film, at least one lightly doped region under said relatively thicker portion of said insulating layer and at least one heavily doped region under said relatively thinner portion of said insulating layer; wherein said step of forming said insulating layer further comprises the steps of: forming a plurality of gate structures over said insulating layer; forming a mask between said gate structures; forming a said mask over said relatively thicker portion of said insulating layer; partially etching said insulating layer to result in said relatively thinner portion of said insulating layer; and removing said mask.

2. The method according to claim 1 wherein said mask is a photoresist.

3. The method according to claim 1 wherein said insulating layer is made of a material selected from a group consisting of silicon nitride, silicon oxide, and the combination thereof.

4. The method according to claim 1 wherein said doping procedure is an N-type ion implantation procedure with constant implantation energy and dosage.

5. The method according to claim 1 wherein said non-single crystal semiconductor film is an LTPS film.

6. The method according to claim 1 wherein said relatively thicker portion of said insulating layer has a thickness range from 200 to 1000Å.

* * * * *